(12) United States Patent
Ahn et al.

(10) Patent No.: US 10,964,827 B2
(45) Date of Patent: *Mar. 30, 2021

(54) SOLAR CELL AND METHOD FOR MANUFACTURING THE SAME

(71) Applicant: LG ELECTRONICS INC., Seoul (KR)

(72) Inventors: Junyong Ahn, Seoul (KR); Younghyun Lee, Seoul (KR); Jinhyung Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 363 days.

This patent is subject to a terminal disclaimer.

(21) Appl. No.: 15/903,653

(22) Filed: Feb. 23, 2018

(65) Prior Publication Data

US 2018/0190843 A1 Jul. 5, 2018

Related U.S. Application Data

(63) Continuation of application No. 12/917,408, filed on Nov. 1, 2010, now Pat. No. 9,935,212.

(30) Foreign Application Priority Data

Dec. 21, 2009 (KR) .................. 10-2009-0127666

(51) Int. Cl.
  *H01L 31/0224* (2006.01)
  *H01L 31/068* (2012.01)
(52) U.S. Cl.
  CPC ........... *H01L 31/022433* (2013.01); *H01L 31/022425* (2013.01); *H01L 31/068* (2013.01); *Y02E 10/547* (2013.01)

(58) Field of Classification Search
  CPC ............. H01L 31/022425; H01L 31/022433
  See application file for complete search history.

(56) References Cited

U.S. PATENT DOCUMENTS

| | | |
|---|---|---|
| 4,461,922 A | 7/1984 | Gay et al. |
| 5,389,159 A | 2/1995 | Kataoka et al. |

(Continued)

FOREIGN PATENT DOCUMENTS

| | | |
|---|---|---|
| EP | 2317560 A2 | 5/2011 |
| KR | 10 2002-0059186 A | 7/2002 |

(Continued)

OTHER PUBLICATIONS

Evidentiary reference: CRC Handbook of Chemistry and Physics, 93rd Ed., 2012-2013, Chapter: "The Elements" (Year: 2012).*

(Continued)

*Primary Examiner* — Sadie White
(74) *Attorney, Agent, or Firm* — Birch, Stewart, Kolasch & Birch, LLP

(57) ABSTRACT

A solar cell includes a first conductive type substrate; an emitter layer of a second conductive type opposite the first conductive type, the emitter layer and the substrate forming a p-n junction; an anti-reflection layer positioned on the emitter layer; a plurality of first electrodes passing through the anti-reflection layer and being electrically connected to the emitter layer, at least one of the plurality of first electrodes including: a first electrode layer and a plurality of first electrode auxiliaries separated from the first electrode layer and positioned around the first electrode layer; and a second electrode layer positioned on the first electrode layer and on the plurality of first electrode auxiliaries; and a second electrode electrically connected to the substrate.

14 Claims, 8 Drawing Sheets

(56) References Cited

U.S. PATENT DOCUMENTS

| | | | |
|---|---|---|---|
| 5,928,438 A * | 7/1999 | Salami | H01L 31/022425 |
| | | | 136/255 |
| 2002/0084503 A1 * | 7/2002 | Lee | H01L 31/022425 |
| | | | 257/456 |
| 2007/0209697 A1 | 9/2007 | Karakida et al. | |
| 2008/0128013 A1 | 6/2008 | Lopatin et al. | |
| 2008/0132082 A1 | 6/2008 | Lopatin et al. | |
| 2009/0101872 A1 | 4/2009 | Young et al. | |
| 2009/0117680 A1 | 5/2009 | Yamazaki et al. | |
| 2009/0277491 A1 | 11/2009 | Nakamura et al. | |
| 2010/0037952 A1 | 2/2010 | Lin | |
| 2010/0132792 A1 | 6/2010 | Kim et al. | |

FOREIGN PATENT DOCUMENTS

| | | |
|---|---|---|
| KR | 10-2003-0088665 A | 11/2003 |
| KR | 10-2006-0066280 A | 6/2006 |
| KR | 10-2010-0056114 A | 5/2010 |

OTHER PUBLICATIONS

Gautero et al., "All-screen-printed 120-A[mu]M-thin large-area silicon solar cells applying dielectric rear passivation and laser-fired contacts reaching 18% efficiency", Photovoltaic Specialists Conference (PVSC), 34th IEEE, IEEE, Piscataway, NJ (Jun. 7, 2009), pp. 1888-1893, XP031626785.
CRC Handbook of Chemistry and Physics, 93rd Ed., 2012-2013, "The Elements."
Sigma Aldrich datasheet for indium oxide—Evidentiary reference.
Sigma Aldrich datasheet for tin oxide—Evidentiary reference.
Umicore specification sheet for ITO—Evidentiary reference.

* cited by examiner 130   141a2                    141a1

SOLAR CELL AND METHOD FOR MANUFACTURING THE SAME

CROSS-REFERENCE TO RELATED APPLICATIONS

This Application is a Continuation of U.S. patent application Ser. No. 12/917,408 filed on Nov. 1, 2010 (now U.S. Pat. No. 9,935,212 issued on Apr. 3, 2018), which claims the priority benefit under 35 U.S.C. § 119(a) to Korean Patent Application No. 10-2009-0127666 filed in the Republic of Korea on Dec. 21, 2009, all of which are hereby expressly incorporated by reference into the present application.

BACKGROUND OF THE INVENTION

Field of the Invention

Embodiments of the invention relate to a solar cell and a method for manufacturing the same.

Discussion of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

SUMMARY OF THE INVENTION

Embodiments of the invention provide a solar cell and a method for manufacturing the same capable of improving the efficiency of the solar cell.

In one aspect, there is a solar cell including a first conductive type substrate, an emitter layer of a second conductive type opposite the first conductive type, the emitter layer and the substrate forming a p-n junction, a plurality of first electrodes electrically connected to the emitter layer, at least one of the plurality of first electrodes including a first electrode layer, a plurality of first electrode auxiliaries separated from the first electrode layer, and a second electrode layer positioned on an upper surface and a lateral surface of the first electrode layer and on an upper surface and a lateral surface of each of the plurality of first electrode auxiliaries, and a second electrode electrically connected to the substrate.

The first electrode layer and each first electrode auxiliary may have the same density.

The first electrode layer and each first electrode auxiliary may each have a different density from the second electrode layer. A density of the first electrode layer and a density of each first electrode auxiliary may be less than a density of the second electrode layer.

The solar cell may further include at least one current collector connected to the plurality of first electrodes.

The at least one current collector may include a first current collector layer, a plurality of second electrode auxiliaries separated from the first current collector layer, and a second current collector layer positioned on an upper surface and a lateral surface of the first current collector layer and on an upper surface and a lateral surface of each of the plurality of second electrode auxiliaries.

A plurality of first electrode layers of the plurality of first electrodes may extend in a direction crossing the first current collector layer of the at least one current collector.

The first electrode layer and the plurality of first electrode auxiliaries may have the same density as the first current collector layer and the second electrode auxiliaries.

The second electrode layer may have the same density as the second current collector layer.

A density of the first current collector layer and a density of each second electrode auxiliary may be less than the density of the second current collector layer.

The first electrode layer, the plurality of first electrode auxiliaries, the first current collector layer, and the second electrode auxiliaries may be formed of the same material.

The second electrode layer and the second current collector layer may be formed of the same material.

The first electrode layer, the plurality of first electrode auxiliaries, the first current collector layer, and the plurality of second electrode auxiliaries may be formed of different materials.

In another aspect, there is a method for manufacturing a solar cell including forming an emitter layer on a substrate, the emitter layer and the substrate forming a p-n junction, forming an anti-reflection layer on the emitter layer, forming a first electrode pattern including an electrode layer pattern on the anti-reflection layer, forming a second electrode pattern on the substrate, forming a plurality of first electrode layers connected to the emitter layer and a plurality of first electrode auxiliaries connected to the emitter layer using the electrode layer pattern and forming a second electrode connected to the substrate using the second electrode pattern, and performing a plating process using the plurality of first electrode layers and the plurality of first electrode auxiliaries as a seed layer to form a plurality of second electrode layers, thereby completing a plurality of first electrodes.

The first electrode pattern and the second electrode pattern may be formed using a screen pattern method.

The first electrode pattern may further include a current collector layer pattern. The forming of the plurality of first electrode layers and the plurality of first electrode auxiliaries may further include forming a plurality of first current collector layers and a plurality of second electrode auxiliaries using the current collector layer pattern.

The completing of the plurality of first electrodes may include forming a plurality of second current collector layers using the plurality of first current collector layers and the plurality of second electrode auxiliaries as a seed layer to thereby complete a plurality of current collectors.

The plating process may be performed using a light induced plating (LIP) method.

The forming of the plurality of first electrode layers, the plurality of first current collector layers, the pluralities of first and second electrode auxiliaries, and the second electrode may include performing a thermal process on the substrate having the first and second electrode patterns so that the first electrode pattern passes through the anti-reflection layer and contracts the emitter layer, and forms the plurality of first electrode layers, the plurality of first electrode auxiliaries separated from the plurality of first electrode layers, the plurality of first current collector layers, and the plurality of second electrode auxiliaries separated from the plurality of first current collector layers.

The forming of the plurality of first electrode layers, the plurality of first current collector layers, the pluralities of first and second electrode auxiliaries, and the second electrode may further include forming a back surface field layer between the substrate and the second electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
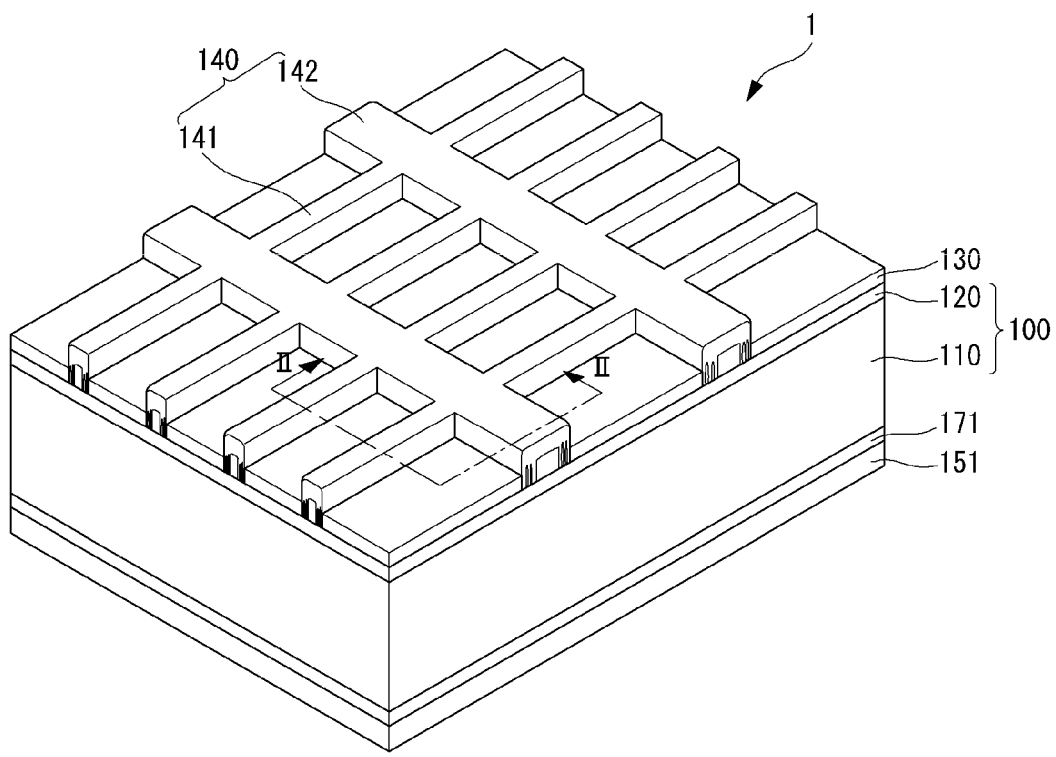
FIG. 1 is a partial perspective view of a solar cell according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thicknesses and the heights of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
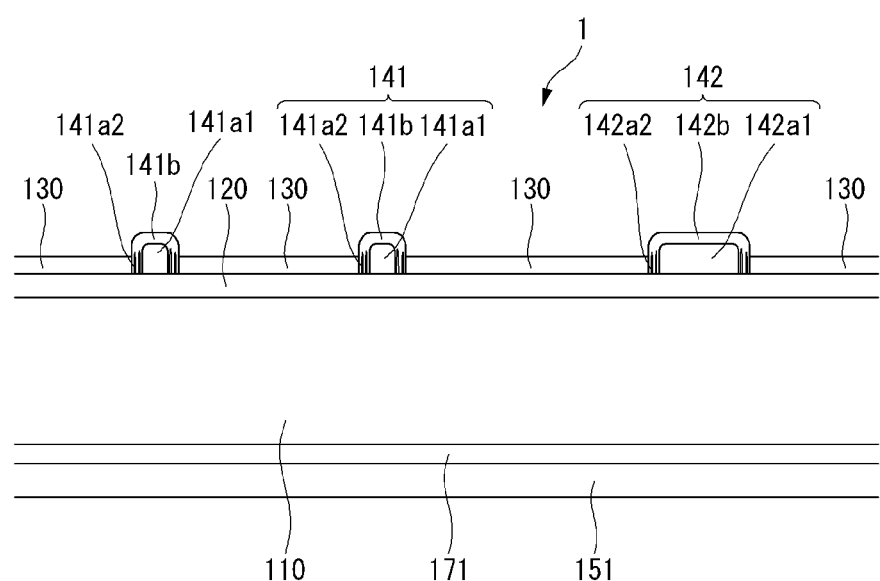
FIG. 2 is a cross-sectional view taken along line II-II of FIG. 1.

FIG. 1 is a partial perspective view of a solar cell according to an embodiment of the invention. FIG. 2 is a cross-sectional view taken along line II-II of FIG. 1.

As shown in FIGS. 1 and 2, a solar cell 1 according to an embodiment of the invention includes a substrate 100 including a first impurity region 110 and an emitter layer 120 corresponding to a second impurity region, an anti-reflection layer 130 positioned on the emitter layer 120 of a surface (hereinafter, referred to as "a front surface") of the substrate 100 on which light is incident, a front electrode part 140 positioned on the emitter layer 120, a back electrode 151 positioned on a surface (hereinafter, referred to as "a back surface") of the substrate 100, opposite the front surface of the substrate 100, on which light is not incident, and a back surface field layer 171 underlying the back electrode 151.

The first impurity region 110 is positioned in the semiconductor substrate 100 formed of first conductive type silicon, for example, p-type silicon, though not required. The first impurity region 110 contains first conductive type impurities. The first impurity region 110 may contain impurities of a group III element such as boron (B), gallium (Ga), and indium (In). Silicon used in the substrate 100 is crystalline silicon, such as single crystal silicon and polycrystalline silicon, or amorphous silicon. Further, the substrate 100 may be formed of n-type silicon. In this instance, the first impurity region 110 may contain impurities of a group V element such as phosphorus (P), arsenic (As), and antimony (Sb). The substrate 100 may be formed of semiconductor materials other than silicon.

The substrate 100 may be textured to have a textured surface corresponding to an uneven surface. In this instance, an amount of light incident on the substrate 100 increases because of the textured surface of the substrate 100, and thus the efficiency of the solar cell 1 is improved.

The emitter layer 120 is the second impurity region of a second conductive type (e.g., n-type) opposite the first conductive type of the substrate 100. Thus, the emitter layer 120 forms a p-n junction along with the first impurity region 110 of the substrate 100. Most of a remaining region excluding the emitter layer 120 from the substrate 100 is the first impurity region 110.

A plurality of electron-hole pairs produced by light incident on the substrate 100 are separated into electrons and holes by a built-in potential difference resulting from the p-n junction of the first impurity region 110 and the emitter layer 120. Then, the separated electrons move to the n-type semiconductor, and the separated holes move to the p-type semiconductor. Thus, when the substrate 100 is of the p-type and the emitter layer 120 is of the n-type in the embodiment of the invention, the separated holes move to the first impurity region 110 and the separated electrons move to the emitter layer 120. As a result, the holes become major carriers in the first impurity region 110, and the electrons become major carriers in the emitter layer 120.

Because the first impurity region 110 and the emitter layer 120 form the p-n junction, the emitter layer 120 may be of the p-type if the substrate 100 is of the n-type unlike the embodiment of the invention described above. In this instance, the separated electrons move to the first impurity region 110 and the separated holes move to the emitter layer 120.

When the emitter layer 120 is an n-type, the emitter layer 120 may be formed by doping the substrate 100 with impurities of a group V element such as phosphor (P), arsenic (As), and antimony (Sb). Alternatively, when the emitter layer 120 is a p-type, the emitter layer 120 may be formed by doping the substrate 100 with impurities of a group III element such as boron (B), gallium (Ga), and indium (In).

The anti-reflection layer 130 on the emitter layer 120 is formed of silicon nitride (SiNx) and/or silicon oxide ($SiO_x$). The anti-reflection layer 130 reduces a reflectance of light incident on the solar cell 1 and increases selectivity of a predetermined wavelength band, thereby increasing the efficiency of the solar cell 1. The anti-reflection layer 130 may have a singe-layered structure or a multi-layered structure such as a double-layered structure. The anti-reflection layer 130 may be omitted, if desired.

As shown in FIGS. 1 and 2, the front electrode part 140 includes a plurality of front electrodes 141 and a plurality of front electrode current collectors 142.

The plurality of front electrodes 141 are electrically and physically connected to the emitter layer 120 and extend substantially parallel to one another in a fixed direction. Each of the front electrodes 141 includes a first front electrode layer 141a1, a plurality of first electrode auxiliaries 141a2, and a second front electrode layer 141b positioned on an upper surface and a lateral surface of the first front electrode layer 141a1 and on an upper surface and a lateral surface of each of the plurality of first electrode auxiliaries 141a2.

The first front electrode layers 141a1 are positioned on the emitter layer 120 and extend substantially parallel to one another in a fixed direction.

Each first front electrode layer 141a1 has a width of approximately 70 µm to 130 µm and a height of approximately 5 µm to 20 µm. When each of the width and the height of the first front electrode layer 141a1 are less than minimum values of the above ranges, the front electrodes 141 do not operate normally. Further, when each of the width and the height of the first front electrode layer 141a1 are greater than maximum values of the above ranges, an incident area of light decreases and a formation material of the front electrodes 141 is unnecessarily wasted because the width and the height of each front electrodes 141 unnecessarily increase.

The plurality of first electrode auxiliaries 141a2 are positioned within approximately 10 µm from the first front electrode layer 141a1. Each first electrode auxiliary 141a2 has a width of approximately 1 µm to 5 µm and is physically separated from the first front electrode layer 141a1.

As above, the second front electrode layer 141b is positioned on the upper and lateral surfaces of the first front electrode layer 141a1 and on the upper and lateral surfaces of each of the first electrode auxiliaries 141a2. In addition, the second front electrode layer 141b is positioned between the first front electrode layer 141a1 and the first electrode auxiliaries 141a2 and between the adjacent first electrode auxiliaries 141a2.

The second front electrode layers 141b are formed using a plating method. In this instance, the first front electrode layers 141a1 and the first electrode auxiliaries 141a2 serve as a seed layer for plating. Hence, as shown in FIGS. 1 and 2, the second front electrode layer 141b on the emitter layer 120 substantially surrounds the first front electrode layer 141a1 underlying the second front electrode layer 141b and the first electrode auxiliaries 141a2 positioned around the first front electrode layer 141a1.

In the embodiment of the invention, the first front electrode layers 141a1 and the first electrode auxiliaries 141a2 are formed using a screen printing method, and the second front electrode layer 141b is formed using the plating method, particularly a light induced plating (LIP) method. Therefore, a density of the second front electrode layers 141b is greater than a density of the first front electrode layers 141a1 and a density of the first electrode auxiliaries 141a2.

The front electrodes 141 collect and transfer carriers (e.g., electrons) moving to the emitter layer 120.

The front electrode current collectors 142 are positioned on the emitter layer 120 and extend substantially parallel to one another in a direction crossing an extending direction of the front electrodes 141. The front electrode current collectors 142 are electrically and physically connected to the emitter layer 120 and the front electrodes 141.

Each of the front electrode current collectors 142 includes a first current collector layer 142a1, a plurality of second electrode auxiliaries 142a2, and a second current collector layer 142b positioned on an upper surface and a lateral surface of the first current collector layer 142a1 and on an upper surface and a lateral surface of each of the plurality of second electrode auxiliaries 142a2.

The first current collector layers 142a1 are placed on the same plane as the first front electrode layers 141a1. The first current collector layers 142a1 extend substantially parallel to one another in a direction crossing the extending direction of the front electrodes 141. Hence, the first current collector layer 142a1 is electrically and physically connected to the corresponding first front electrode layers 141a1 at each of crossings of the first front electrode layers 141a1 and the first current collector layers 142a1.

The plurality of second electrode auxiliaries 142a2 are positioned within approximately 10 µm from the first current collector layer 142a1. Each second electrode auxiliaries 142a2 has a width of approximately 1 µm to 5 µm and is physically separated from the first current collector layer 142a1.

The second current collector layers 142b are formed using a plating method along with the second front electrode layers 141b. Accordingly, in the same manner as the second front electrode layer 141b, the second current collector layer 142b is positioned on the upper and lateral surfaces of the first current collector layer 142a1 and on the upper and lateral surfaces of each of the second electrode auxiliaries 142a2. In addition, the second current collector layer 142b is positioned between the first current collector layer 142a1 and the second electrode auxiliaries 142a2 and between the adjacent second electrode auxiliaries 142a2. In this instance, the first current collector layers 142a1 and the second electrode auxiliaries 142a2 serve as a seed layer for plating.

Each second current collector layer 142b has a thickness of approximately 5 µm to 20 µm.

In the embodiment of the invention, because the second current collector layers 142b are placed on the same level layer as the second front electrode layers 141b. The second front electrode layer 141b and the second current collector layer 142b are electrically and physically connected to each other at each of crossings of the first front electrode layers 141a1 and the first current collector layers 142a1.

Because the front electrode current collectors 142 are connected to the front electrodes 141, the front electrode current collectors 142 collect carriers transferred through the front electrodes 141 and output the carriers to the outside.

The front electrode part 140 contains a conductive material such as silver (Ag). Alternatively, the front electrode part 140 may contain at least one selected from the group consisting of nickel (Ni), copper (Cu), aluminum (Al), tin (Sn), zinc (Zn), indium (In), titanium (Ti), gold (Au), and a combination thereof. Other conductive materials may be used.

In the embodiment of the invention, the first front electrode layer 141a1, the first electrode auxiliaries 141a2, the first current collector layer 142a1, and the second electrode auxiliaries 142a2 are formed using the same material. The second front electrode layer 141b and the second current collector layer 142b are formed using the same material. In other embodiments of the invention, the first front electrode layer 141a1, the first electrode auxiliaries 141a2, the first current collector layer 142a1, the second electrode auxiliaries 142a2, the second front electrode layer 141b, and the second current collector layer 142b may be formed using different materials. While the first front electrode layer 141a1, the first electrode auxiliaries 141a2, the first current collector layer 142a1, and the second electrode auxiliaries 142a2 contain a conductive material other than Ag, the second front electrode layer 141b and the second current collector layer 142b are formed of only Ag.

The anti-reflection layer 130 is positioned on the emitter layer 120, on which the front electrode part 140 is not positioned, because of the front electrode part 140 electrically and physically connected to the emitter layer 120.

The back electrode 151 on the back surface of the substrate 100 collects carriers (e.g., holes) moving to the first impurity region 110. The back electrode 151 contains at least one conductive material such as Al. Alternatively, the back electrode 151 may contain at least one selected from the group consisting of Ni, Cu, Ag, Sn, Zn, In, Ti, Au, and a combination thereof. Other conductive materials may be used.

The back surface field layer 171 between the back electrode 151 and the first impurity region 110 of the substrate 100 is a region (for example, a p+-type region) that is more heavily doped with impurities of the same conductive type as the first impurity region 110 than the first impurity region 110. The movement of electrons to the back surface of the substrate 100 is prevented or reduced by a potential barrier resulting from a difference between impurity doping concentrations of the first impurity region 110 and the back surface field layer 171. Thus, a recombination and/or a disappearance of the electrons and the holes around the surface of the substrate 100 are prevented or reduced.

The solar cell 1 having the above-described structure may further include a back electrode current collector on the back surface of the substrate 100. The back electrode current collector may be electrically connected to the back electrode 151 and may collect carriers transferred from the back electrode 151 to output the carriers to the outside. The back electrode current collector may contain at least one conductive material such as Ag.

An operation of the solar cell 1 having the above-described structure is described below.

When light irradiated to the solar cell 1 is incident on the substrate 100 through the emitter layer 120, a plurality of electron-hole pairs are generated in the substrate 100 by light energy based on the incident light. In this instance, because a reflection loss of light incident on the substrate 100 is reduced by the anti-reflection layer 130, an amount of light incident on the substrate 100 further increases.

The electron-hole pairs are separated into electrons and holes by the p-n junction of the first impurity region 110 of the substrate 100 and the emitter layer 120, and the separated electrons move to the n-type emitter layer 120 and the separated holes move to the p-type first impurity region 110. The electrons moving to the n-type emitter layer 120 are collected by the front electrodes 141 and then move to the front electrode current collectors 142 electrically connected to the front electrodes 141. The holes moving to the p-type first impurity region 110 are collected by the back electrode 151 through the back surface field layer 171 and then move. When the front electrode current collectors 142 are connected to the back electrode 151 using electric wires, current flows therein to thereby enable use of the current for electric power.

The second front electrode layers 141b and the second current collector layers 142b are formed using, not only the first front electrode layers 141a1 and the first current collector layers 142a1 but also the first electrode auxiliaries 141a2 and the second electrode auxiliaries 142a2 positioned around the layers 141a1 and 142a1, as a seed layer. Therefore, a width of each second front electrode layer 141b and a width of each second current collector layer 142b increase. As a result, an interconnect resistance of each second front electrode layer 141b and an interconnect resistance of each second current collector layer 142b decrease, and a transfer rate of carriers is improved.

Because the first electrode auxiliaries 141a2 and the second electrode auxiliaries 142a2 contacting the emitter layer 120 are used as a transfer path of carriers, a contact resistance between the first electrode auxiliaries 141a2 and the emitter layer 120 and a contact resistance between the second electrode auxiliaries 142a2 and the emitter layer 120 decrease. Hence, the transfer rate of carriers is further improved and a loss of carriers is reduced.

Because a density of the front electrode part 140 formed using the plating method is greater than a density of the front electrode part 140 formed using the screen printing method, the conductivity of the front electrode part 140 formed using the plating method is improved. Accordingly, because the front electrode part 140 is formed using the plating method in the embodiment of the invention, a line width of the front electrode part 140 formed using the plating method is less than a line width of the front electrode part 140 formed using the screen printing method. Hence, an amount of light incident on the solar cell 1 increases, and the efficiency of the solar cell 1 is improved.

A method for manufacturing the solar cell 1 according to the embodiment of the invention is described below with reference to FIGS. 3A to 3E and FIGS. 4A and 4B.

FIGS. 3A to 3E are cross-sectional views sequentially illustrating each of stages in a method of manufacturing the solar cell according to the embodiment of the invention. FIG. 4A illustrates a photograph of a portion of the first front electrode layer and a portion of the first electrode auxiliaries positioned around the first front electrode layer after a firing process is performed. FIG. 4B illustrates a photograph of a portion of the second front electrode layer after a plating process is completed.

Figure 3A:
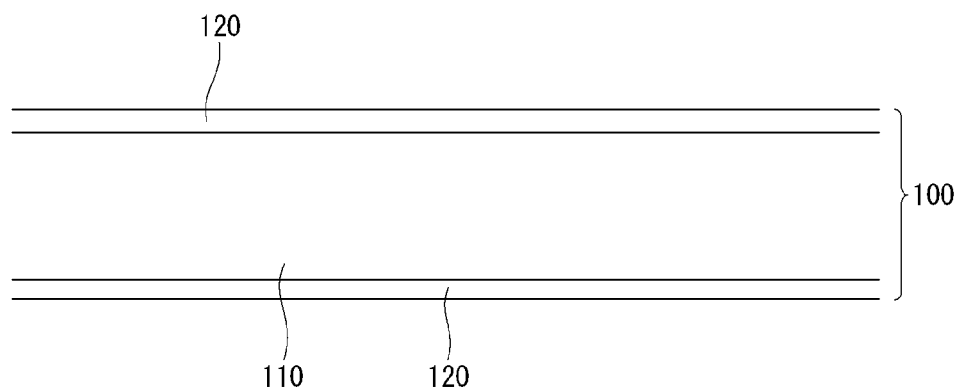
FIGS. 3A to 3E are cross-sectional views sequentially illustrating each of stages in a method of manufacturing a solar cell according to an embodiment of the invention.
Figure 4A:
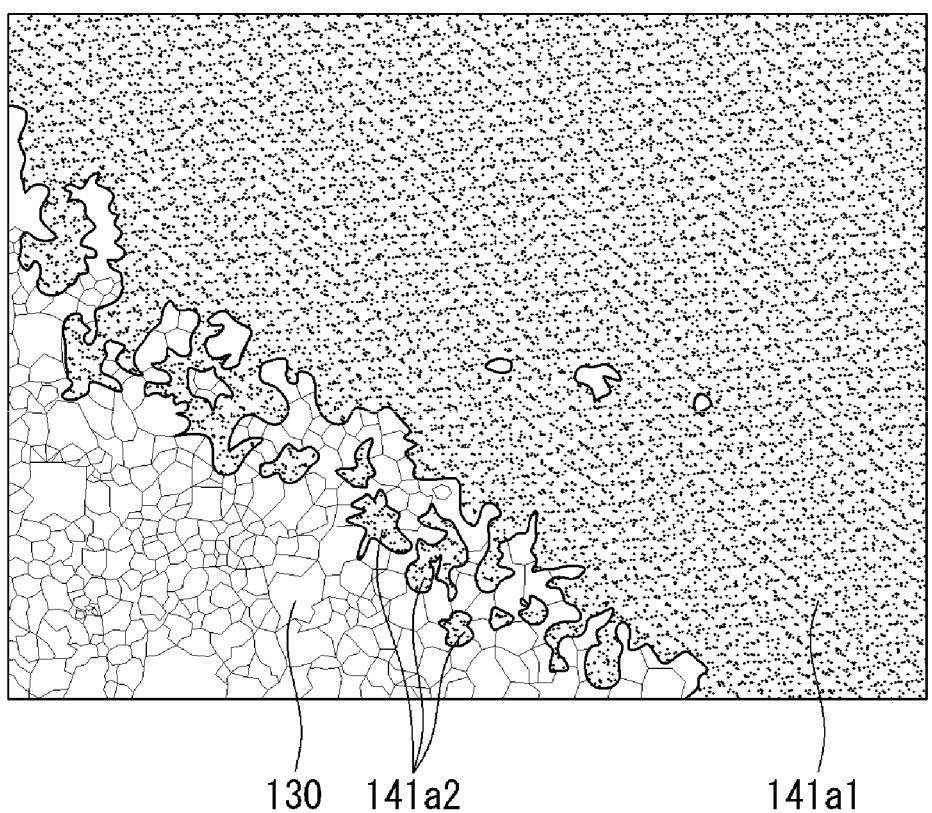
FIG. 4A illustrates a photograph of a portion of a first front electrode layer and a portion of first electrode auxiliaries positioned around the first front electrode layer after a firing process is performed.
Figure 4B:
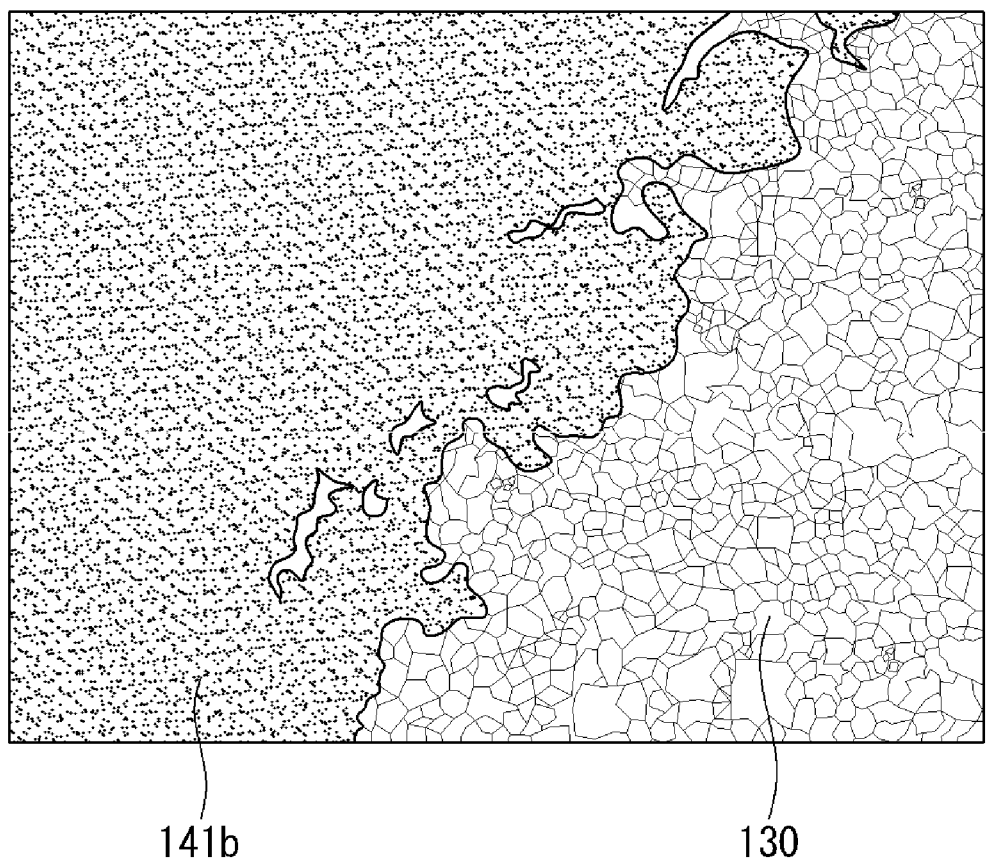
FIG. 4B illustrates a photograph of a portion of a second front electrode layer after a plating process is completed.

First, as shown in FIG. 3A, a high temperature thermal process of a material (for example, $POCl_3$ or $H_3PO_4$) containing impurities of a group V element such as P, As, and Sb is performed on the substrate 100 formed of p-type single crystal silicon or p-type polycrystalline silicon to distribute the group V element impurities on the substrate 100. Hence, the n-type emitter layer 120 is formed in the entire surface of the substrate 100 including a front surface, a back surface, and lateral surfaces of the substrate 100. When the substrate 100 is of an n-type unlike the embodiment of the invention, a high temperature thermal process of a material (for example, $B_2H_6$) containing group III element impurities may be performed on the substrate 100 or the material containing the group III element impurities may be stacked on the substrate 100 to form the p-type emitter layer 120 in the entire surface of the substrate 100.

Subsequently, phosphorous silicate glass (PSG) containing phosphor (P) or boron silicate glass (BSG) containing boron (B) produced when p-type impurities or n-type impurities are distributed inside the substrate 100 is removed through an etching process.

Accordingly, after the formation of the emitter layer 120 is completed, the substrate 100 is divided into the first impurity region 110 and the emitter layer 120 being the second impurity region.

If necessary, before the emitter layer 120 is formed, a texturing process may be performed on the entire surface of the substrate 100 to form a textured surface of the substrate 100. When the substrate 100 is formed of single crystal silicon, the texturing process may be performed using a basic solution such as KOH and NaOH. When the substrate 100 is formed of polycrystalline silicon, the texturing process may be performed using an acid solution such as HF and $HNO_3$.

Figure 3B:
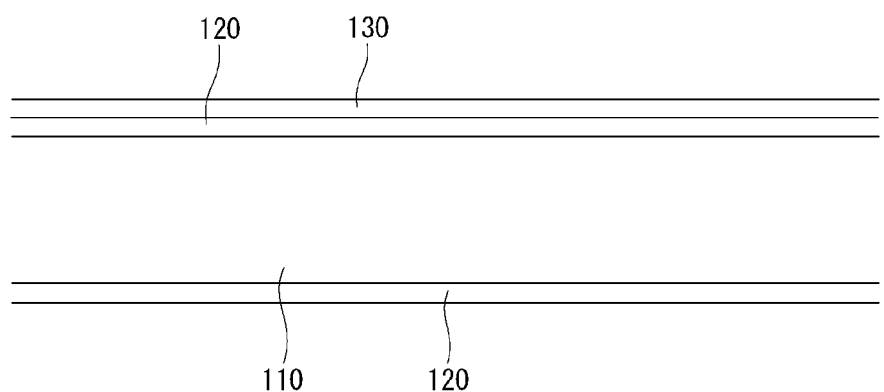

Next, as shown in FIG. 3B, the anti-reflection layer 130 is formed on the front surface of the substrate 100 using a chemical vapor deposition (CVD) method such as a plasma enhanced chemical vapor deposition (PECVD) method.

Figure 3C:
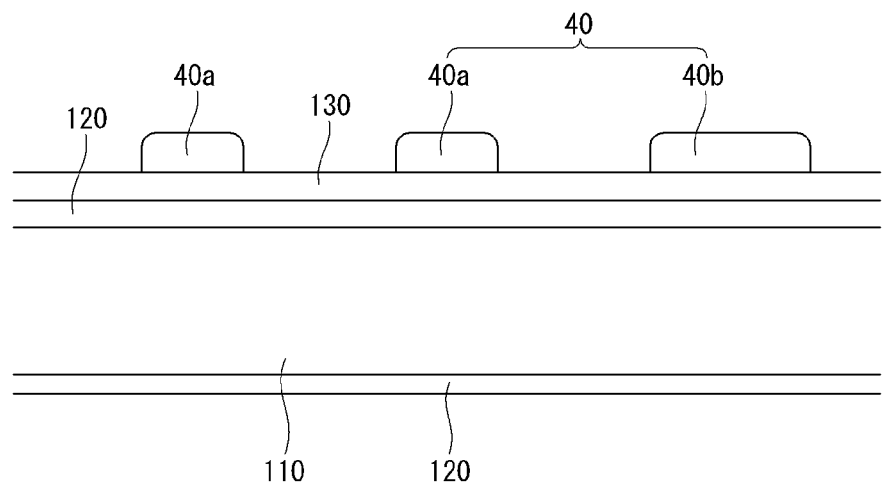

Next, as shown in FIG. 3C, a front electrode part paste containing Ag is coated on a desired portion of the anti-reflection layer 130 using the screen printing method and then is dried at about 170° C. to form a front electrode part pattern 40. The front electrode part pattern 40 includes a first front electrode layer pattern 40a and a first current collector layer pattern 40b. The front electrode part paste may contain at least one selected from the group consisting of Ni, Cu, Al, Sn, Zn, In, Ti, Au, and a combination thereof, instead of, or in addition to, Ag. The front electrode part paste may contain an organic material such as a binder.

Figure 3D:
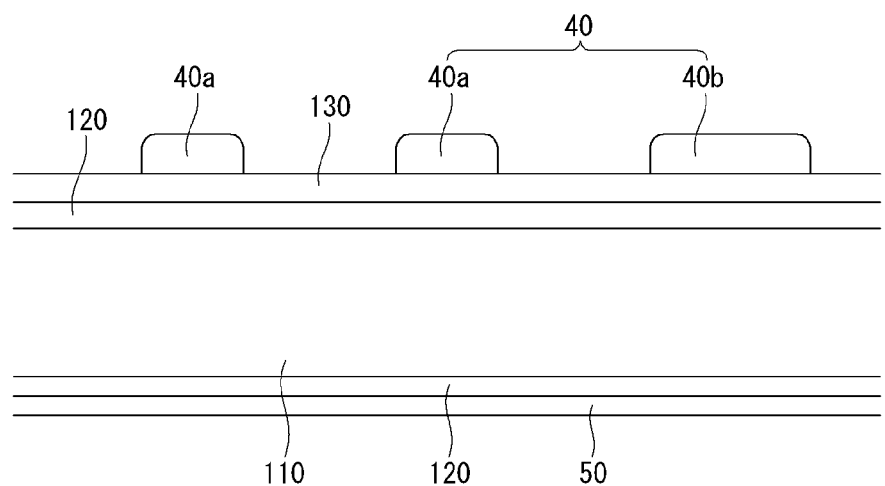

Next, as shown in FIG. 3D, a paste containing Al and an organic material is coated on the back surface of the substrate 100 using the screen printing method and then is dried to form a back electrode pattern 50. The back electrode paste may contain at least one selected from the group consisting of Ni, Cu, Ag, Sn, Zn, In, Ti, Au, and a combination thereof, instead of, or in addition to, Al.

In the embodiment of the invention, a formation order of the front electrode part pattern 40 and the back electrode pattern 50 may vary.

Figure 3E:
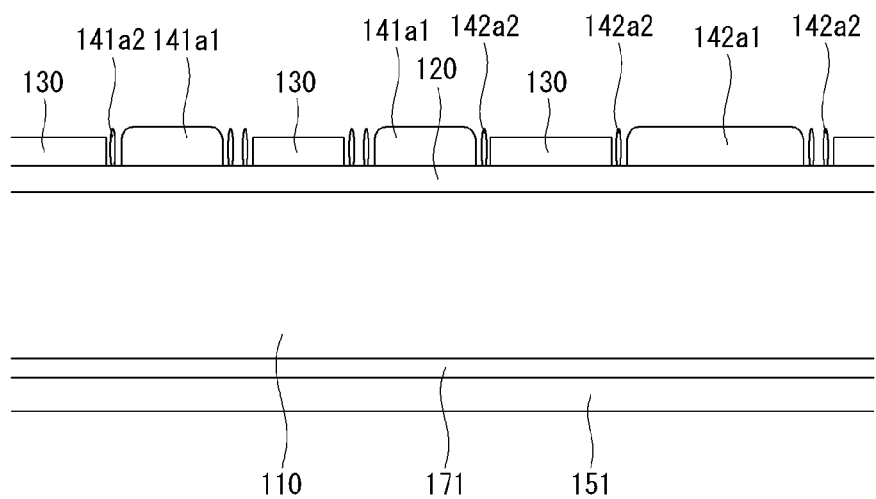

Next, as shown in FIG. 3E, a firing process is performed on the substrate 100 including the front electrode part pattern 40 and the back electrode pattern 50 at a temperature of about 750° C. to 800° C. to form the first front electrode layers 141a1, the first electrode auxiliaries 141a2, the first current collector layers 142a1, the second electrode auxiliaries 142a2, the back electrode 151, and the back surface field layer 171.

More specifically, when a thermal process is performed, the first front electrode layers 141a1 and the first current collector layers 142a1 are formed due to an element such as lead (Pb) contained in the front electrode part pattern 40 including the first front electrode layer pattern 40a and the first current collector layer pattern 40b. In other words, the first front electrode layer pattern 40a passes through a contact portion of the anti-reflection layer 130 underlying the first front electrode layer pattern 40a to form the first front electrode layers 141a1 contacting the emitter layer 120, and the first current collector layer pattern 40b passes through a contact portion of the anti-reflection layer 130 underlying the first current collector layer pattern 40b to form the first current collector layers 142a1 contacting the emitter layer 120. Further, the back electrode 151 electrically and physically connected to the substrate 100 is formed on the back surface of the substrate 100. In this instance, metal components contained in each of the patterns 40a, 40b, and 50 chemically couples with the layers 120 and 110 contacting the patterns 40a, 40b, and 50, and thus a contact resistance is reduced. Hence, a current flow is improved.

Volatile component such as an organic material contained in the front electrode part paste is evaporated in the thermal process, and the coated front electrode part pattern 40 is contracted in transverse and longitudinal directions. Hence, residues separated from the front electrode part pattern 40 are generated around the front electrode part pattern 40. The residues pass through the anti-reflection layer 130 in the firing process and is electrically and physically connected to the emitter layer 120 underlying the anti-reflection layer 130. Thus, the residues separated from the first front electrode layer pattern 40a becomes the first electrode auxiliaries 141a2, and the residues separated from the first current collector layer pattern 40b becomes the second electrode auxiliaries 142a2. The contraction of the front electrode part pattern 40 may be generated in the drying process performed after the front electrode part paste is coated. In an embodiment of the invention, portions of the anti-reflection layer 130 may be partly disposed between the first front electrode layers 141a1 and the first electrode auxiliaries 141a2, between the first electrode auxiliaries 141a2, between the first current collector layers 142a1 and the second electrode auxiliaries 142a2, and between the second electrode auxiliaries 142a2.

Also, in an embodiment of the invention, both a portion of the second front electrode layers 141b and a portion of the anti-reflection layer 130 may be partly disposed between the first front electrode layers 141a1 and the first electrode auxiliaries 141a2, and/or between the first electrode auxiliaries 141a2. Also, both a portion of the second current collector layers 142b and a portion of the anti-reflection layer 130 may be partly disposed between the first current collector layers 142a1 and the second electrode auxiliaries 142a2, and/or between the second electrode auxiliaries 142a2. In this instance, the portion of second front electrode layers 141b and the portion of the second current collector layers 142b respectively contact the respective portions of the anti-reflection layer 130 at contact areas.

FIG. 4A illustrates a photograph of a portion of the first front electrode layer 141a1 and a portion of the first electrode auxiliaries 141a2 separated from the first front electrode layer 141a1 after the firing process is performed. As shown in FIG. 4A, the first electrode auxiliaries 141a2 separated from the first front electrode layer 141a1 exist around, or in a vicinity of, the first front electrode layer 141a1.

Further, during the thermal process, Al contained in the back electrode 151 is distributed on the substrate 100 contacting the back electrode 151 to form the back surface field layer 171 between the back electrode 151 and the substrate 100. The back surface field layer 171 is an impurity region doped with impurities of the same conductive type as the first impurity region 110 of the substrate 100, for example, p-type impurities. An impurity doping concentration of the back surface field layer 171 is higher than an impurity doping concentration of the substrate 100, and thus the back surface field layer 171 is a p+-type region.

Subsequently, the second front electrode layers 141b and the second current collector layers 142b are formed on the upper surfaces and the lateral surfaces of each first front electrode layer 141a1, each first electrode auxiliary 141a2, each first current collector layer 142a1, and each second electrode auxiliary 142a2, between the first electrode auxiliaries 141a2, and between the second electrode auxiliaries 142a2 using the first front electrode layers 141a1, the first electrode auxiliaries 141a2, the first current collector layers 142a1, and the second electrode auxiliaries 142a2 on the front surface of the substrate 100 as a seed layer through the light induced plating (LIP) method to thereby complete the front electrode part 140. Next, an edge isolation process for removing the emitter layer 120 formed in edges of the substrate 100 is performed using a laser beam to electrically separate the emitter layer 120 on the front surface of the substrate 100 from the emitter layer 120 on the back surface of the substrate 100. Finally, the solar cell 1 shown in FIGS. 1 and 2 is completed.

The second front electrode layers 141b and the second current collector layers 142b are uniformly plated in all directions to have a uniform plating thickness, and the plating thickness is approximately 3 μm to 10 μm.

The LIP method is a method for forming a film by irradiating light to the seed layer and generating a current based on the light. The plating using the LIP method is smoothly achieved at formation locations of the first and second electrode auxiliaries 141a2 and 142a2 around the first front electrode layer pattern 40a and the first current collector layer pattern 40b as well as at formation locations of the first front electrode layer pattern 40a and the first current collector layer pattern 40b. Thus, the LIP method is more advantageous than an electroplating method to plate the first and second electrode auxiliaries 141a2 and 142a2.

As above, because the plating process is performed based on the first and second electrode auxiliaries 141a2 and 142a2 around the first front electrode layers 141a1 and the first current collector layers 142a1 as well as the first front electrode layers 141a1 and the first current collector layers 142a1, the width of the second front electrode layers 141b and the width of the second current collector layers 142b respectively extend to the first and second electrode auxiliaries 141a2 and 142a2. Hence, the line width of the front electrodes 141 and the line width of the front electrode current collectors 142 increase.

FIG. 4B illustrates a photograph of a portion of the second front electrode layer 141b after the plating process is completed. It can be seen from FIG. 4B that because the plating process is performed on the first electrode auxiliaries 141a2 around the second front electrode layer 141b as well as the second front electrode layer 141b, the width of the second front electrode layer 141b increases to a plated portion plated using the first electrode auxiliaries 141a2 as the seed layer.

As above, as the line width of each front electrode 141 and the line width of each front electrode current collector 142 increase, the interconnect resistance of each front electrode 141 and the interconnect resistance of each front electrode current collector 142 decrease. Hence, the conductivity of carriers is improved.

Further, because a contact area between the front electrode part 140 and the emitter layer 120 increases because of the first and second electrode auxiliaries 141a2 and 142a2, a contact resistance between the front electrode part 140 and the emitter layer 120 decreases.

Because a density of interconnects formed using the plating method is generally greater than a density of interconnects formed using the screen printing method, the conductivity of interconnects is improved. Accordingly, the conductivity of the front electrode part 140 formed in the embodiment of the invention is greater than the conductivity of the front electrode part formed using the screen printing method. Further, even if the front electrode parts with the same conductivity are formed, the line width of the front electrode part 140 in the embodiment of the invention is less than the line width of the front electrode part formed using the screen printing method. Accordingly, because light is incident on an area obtained by a reduction in the line width of the front electrode part 140, an incident area of light increases and the efficiency of the solar cell 1 is improved. In addition, because the density of the front electrode part 140 on the front surface of the substrate 100 increases, a bowing phenomenon of the substrate 100 generated by the back electrode 151 on the back surface of the substrate 100 is prevented or reduced.

Figure 5:
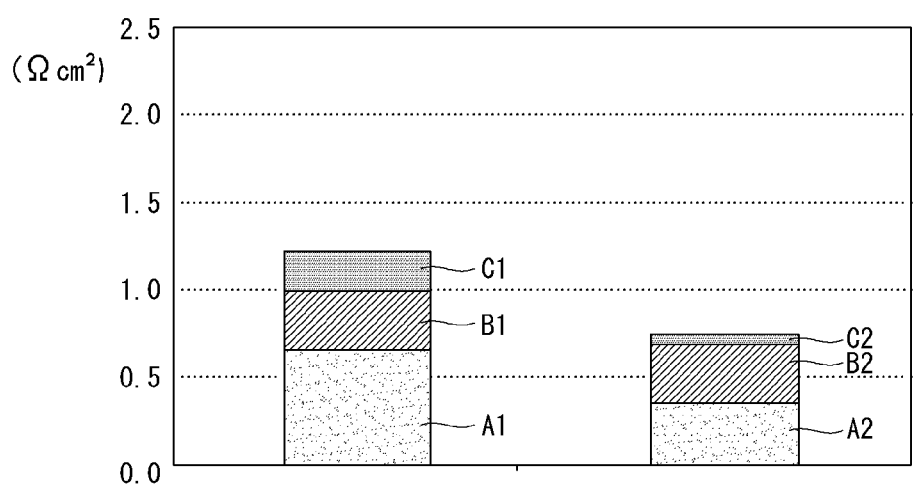
FIG. 5 illustrates characteristics of a related art front electrode formed using a screen printing method and characteristics of a front electrode formed according to an embodiment of the invention.

FIG. 5 illustrates a contact resistance between the emitter layer and the front electrode, a surface resistance of the emitter layer, and an interconnect resistance of the front electrode when the front electrode is formed using the screen printing method in the related art and when the front electrode is formed according to the embodiment of the invention. In FIG. 5, a mask having a mesh with the size of approximately 60 μm was used to coat the front electrode and the first front electrode layer through the screen printing method.

As shown in FIG. 5, when the front electrode was formed using the screen printing method in the related art, an interconnect resistance A1 of the front electrode was approximately 0.653 $\Omega cm^2$, a surface resistance B1 of the emitter layer was approximately 0.334 $\Omega cm^2$, and a contact resistance C1 between the emitter layer and the front electrode was approximately 0.236 $\Omega cm^2$. On the other hand, when the front electrode is formed according to the embodiment of the invention, an interconnect resistance A2 of the front electrode was approximately 0.353 $\Omega cm^2$ and a contact resistance C2 between the emitter layer and the front electrode was approximately 0.06 $\Omega cm^2$. As can be seen from FIG. 5, the interconnect resistance A2 and the contact resistance C2 were greatly reduced as compared with the related art. Further, because a surface resistance of the emitter layer generally varies depending on an impurity concentration, the related art surface resistance B1 and a surface resistance B2 of the embodiment are equal to each other.

The solar cell 1 according to the embodiment of the invention includes the plurality of front electrode current collectors 142 on the light incident surface of the substrate 100. However, only the plurality of front electrodes 141 may be formed on the light incident surface of the substrate 100.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a first conductive type substrate;

an emitter layer of a second conductive type opposite the first conductive type, the emitter layer and the substrate forming a p-n junction;
an anti-reflection layer positioned on the emitter layer;
a plurality of first electrodes passing through the anti-reflection layer and being electrically connected to the emitter layer, at least one of the plurality of first electrodes including:
a first electrode layer;
a plurality of first electrode auxiliaries separated from the first electrode layer in a first direction crossing a longitudinal direction of the first electrode layer and positioned around the first electrode layer; and
a second electrode layer positioned on the first electrode layer and on the plurality of first electrode auxiliaries;
a second electrode electrically connected to the substrate; and
at least one current collector connected to the plurality of first electrodes, and extended in a direction perpendicular to a longitudinal direction of the plurality of first electrodes,
wherein a width of the first electrode layer in the first direction is wider than a width of the plurality of first electrode auxiliaries in the first direction, and
wherein the plurality of first electrode auxiliaries are disposed on a plane including the longitudinal direction and a width direction of the first electrode layer with respect to the first electrode layer.

2. The solar cell of claim 1, wherein the first electrode layer and each first electrode auxiliary each have a different density from the second electrode layer.

3. The solar cell of claim 2, wherein a density of the first electrode layer and a density of each first electrode auxiliary are less than a density of the second electrode layer.

4. The solar cell of claim 1, wherein the at least one current collector includes a first current collector layer and a plurality of second electrode auxiliaries separated from the first current collector layer, and
wherein the first electrode layer, the plurality of first electrode auxiliaries, the first current collector layer, and the plurality of second electrode auxiliaries are formed of the same material.

5. The solar cell of claim 4, wherein the at least one current collector includes a second current collector layer positioned on an upper surface and a lateral surface of the first current collector layer and on an upper surface and a lateral surface of each of the plurality of second electrode auxiliaries, and
wherein the second electrode layer and the second current collector layer are formed of the same material.

6. The solar cell of claim 1, wherein the at least one current collector includes a first current collector layer and a plurality of second electrode auxiliaries separated from the first current collector layer, and
wherein the first electrode layer, the plurality of first electrode auxiliaries, the first current collector layer, and the plurality of second electrode auxiliaries are formed of different materials.

7. The solar cell of claim 1, wherein the second electrode layer is positioned between the first electrode layer and the plurality of first electrode auxiliaries, and between adjacent ones of the plurality of first electrode auxiliaries.

8. The solar cell of claim 1, wherein the second electrode layer is connected to the emitter layer, and positioned directly on the emitter layer.

9. The solar cell of claim 1, wherein the plurality of first electrode auxiliaries are positioned to be spaced apart from each other between two adjacent portions of the anti-reflection layer.

10. The solar cell of claim 1, wherein lower surfaces of the first electrode layer, the plurality of first electrode auxiliaries and the second electrode layer are positioned in the same layer.

11. The solar cell of claim 1, wherein exposed surfaces of the first electrode layer and the plurality of first electrode auxiliaries are surfaces thereof that are not in direct physical contact with the emitter layer.

12. The solar cell of claim 1, wherein the anti-reflection layer is positioned between the first electrode layer and the plurality of first electrode auxiliaries, and
wherein the second electrode layer is positioned on the first electrode layer, the plurality of first electrode auxiliaries, and a portion of the anti-reflection layer between the first electrode layer and the plurality of first electrode auxiliaries.

13. The solar cell of claim 1, wherein the plurality of first electrode auxiliaries are not in direct contact with the first electrode layer.

14. The solar cell of claim 1, wherein the plurality of first electrode auxiliaries are formed of the same material from that of the first electrode layer, and
wherein the second electrode layer is formed of a different material from that of the plurality of first electrode auxiliaries and the first electrode layer.

* * * * *